United States Patent
Jennings et al.

(10) Patent No.: US 7,041,931 B2
(45) Date of Patent: May 9, 2006

(54) STEPPED REFLECTOR PLATE

(75) Inventors: Dean Jennings, San Ramon, CA (US); Joseph M. Ranish, San Jose, CA (US); Brian Haas, San Jose, CA (US); Ajit Balakrishna, Sunnyvale, CA (US); Sundar Ramamurthy, Fremont, CA (US); Aaron Hunter, Santa Cruz, CA (US); Mark Yam, Monte Sereno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 10/280,660

(22) Filed: Oct. 24, 2002

(65) Prior Publication Data

US 2004/0079746 A1    Apr. 29, 2004

(51) Int. Cl.
 *F27B 5/14*    (2006.01)
(52) U.S. Cl. ............... 219/39; 219/405; 219/411; 392/416; 392/418; 118/724; 118/725; 118/50.1
(58) Field of Classification Search ............ 219/390, 219/405, 411; 392/416, 418; 118/724, 725, 118/50.1; 374/120–121, 130–131, 126, 128, 374/161

See application file for complete search history.

(56) References Cited

U.S. PATENT DOCUMENTS

| | | | |
|---|---|---|---|
| 5,155,336 A | 10/1992 | Gronet et al. | 219/411 |
| 5,635,409 A | 6/1997 | Moslehi | 438/7 |
| 5,660,472 A * | 8/1997 | Peuse et al. | 374/128 |
| 5,716,133 A | 2/1998 | Hosokawa et al. | 374/121 |
| 5,993,059 A | 11/1999 | O'Neill et al. | 374/126 |
| 6,007,241 A | 12/1999 | Yam et al. | 374/131 |
| 6,127,658 A | 10/2000 | Kohav | 219/390 |
| 6,142,663 A | 11/2000 | Takasuka | 374/131 |
| 6,160,242 A | 12/2000 | Guardado | 219/390 |
| 6,174,080 B1 | 1/2001 | Jennings | 374/131 |
| 6,183,130 B1 | 2/2001 | Adams et al. | 374/131 |
| 6,215,106 B1 | 4/2001 | Boas et al. | 219/390 |
| 6,641,302 B1 * | 11/2003 | Li et al. | 374/130 |

* cited by examiner

*Primary Examiner*—Shawntina Fuqua
(74) *Attorney, Agent, or Firm*—Charles S. Guenzer, Esq.

(57) ABSTRACT

In a system for thermal processing of a semiconductor substrate, a reflector plate has a stepped surface facing the substrate during heating and cooling of the substrate. The raised surface of the reflector plate has reduced reflectivity, providing advantages during, among other things, cooling of the substrate. The reflector plate also includes a number of recesses to which one or more pyrometers are coupled. These recesses have a highly reflective surface, providing advantages in the performance of the pyrometers.

32 Claims, 5 Drawing Sheets

TO PYROMETER

TO PYROMETER

STEPPED REFLECTOR PLATE

BACKGROUND OF THE INVENTION

This invention relates to apparatus and methods of thermally processing a material such as a semiconductor substrate.

A number of applications involve thermal processing of semiconductor and other materials which require precise measurement and control of the temperature of the material. For instance, processing of a semiconductor substrate requires precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are critical parameters that influence the overall device performance and fabrication yield. At least some of these processes require variations in temperature across the substrate of less than a few degrees Celsius.

As used herein, the term substrate broadly refers to any object that is being processed in a thermal processing chamber. Such substrates may include, for example, semiconductor wafers, flat panel displays, glass plates or disks, and plastic workpieces.

One element for minimizing variations in substrate temperature during processing is precise measurement of the temperature of the wafer. One method for precisely measuring substrate temperature is optical pyrometry. In that method, the radiation emitted by the substrate is measured to determine the substrate's temperature. The relationship between spectral emitted intensity and the temperature of the emitting object depends on the spectral emissivity of the substrate and the ideal blackbody radiation-temperature relationship, given by Planck's Distribution. Using known approximations, including an approximation known as Wein's Displacement Law, the temperature can be approximated from the wavelength of light having the peak emission or it can be determined using the Stefan-Boltzmann Law from the spectral emitted intensity.

However, optical pyrometry suffers from limitations due to the inability to accurately measure the emissivity of a substrate. Moreover, even if the emissivity of a substrate is known at a given temperature, it changes as a function of temperature. These changes are difficult to measure and therefore introduce an unknown error into the temperature measurements. Errors on the order of 10 degrees Celsius are not uncommon.

The emissivity of a substrate can be affected by many factors, including the characteristics of the wafer itself, such as the wafer's temperature, surface roughness, doping level of various impurities, and material composition and thickness of surface layers. Other factors include the characteristics of the process chamber and the process history of the wafer.

Various techniques have been employed to reduce the effects of changes in emissivity. One such technique involves placing a thermal reflecting body near the back surface of the target substrate so that thermal radiation from the substrate is reflected back to the substrate. The reflector may be said to form a reflecting cavity with the substrate. A light pipe may be inserted through the reflector into the cavity to sample radiation from the reflecting cavity and deliver the sample light to a pyrometer. U.S. Pat. No. 5,660,472, which is incorporated herein by reference, describes such techniques.

If the reflector were an ideal reflector, all of the thermal radiation emitted from the substrate would be reflected back onto the substrate, so that the reflecting cavity would act like an ideal black body. In other words, the intensity of the thermal radiation within the reflective cavity would not be a function of the emissivity of the surface of the substrate. The reflective cavity would increase the effective emissivity of the substrate to a value equal to one. Because the reflector is actually less than perfect, however, the effective emissivity of the substrate is higher than the emissivity of the substrate but less than one. Nevertheless, some error is necessarily introduced because the reflector is not an ideal reflector, and so the light received by the pyrometer is not perfectly representative of the light emitted by the substrate.

Another important element in thermal processing of substrates is the ability to control the temperature of the substrate. Generally, the substrate must be rapidly heated and cooled within very precise parameters over a wide range of temperature. A number of techniques are known for providing rapid and controllable heating and cooling. For instance, it is known to change the rate at which heat is transferred between the substrate and a heat source or thermal reservoir during processing of the substrate by applying different gases to the processing chamber. For instance, the rate at which the substrate is heated can be significantly increased by providing a purge gas with a relatively low thermal conductivity (e.g., nitrogen, argon, xenon, or a combination of two or more of these gases) in the reflective cavity during heating of the substrate. Likewise, the rate at which the substrate is cooled can be significantly increased by providing a purge gas with a relatively high thermal conductivity (e.g., helium, hydrogen, or a combination of those gases) between the substrate and a thermal reservoir during the cool-down phase of the processing. U.S. Pat. No. 6,215,106B1, which is incorporated herein by reference, describes such techniques. These methods, however, require careful control of the gases, which can complicate and/or prolong the process.

SUMMARY

The present invention is generally directed to a method and apparatus for thermally processing a substrate. Generally, a reflector has a stepped surface including a number of recesses. Pyrometers are coupled to the recesses, and the surface of the reflector in the recesses is highly reflective to optimize the performance of the pyrometers. Other portions of the reflector surface have reduced reflectivity, to promote rapid cooling of the substrate. The stepped surface also reduces the volume of purge gas needed to fill the process chamber.

The invention has particular use in a thermal processing system in which one or more pyrometers are employed to measure the substrate temperature. Specifically, each pyrometer measures the intensity of radiation emitted by the substrate. The configuration of the pyrometers is such that, using the Stefan-Boltzmann Law, the temperature of the substrate can be calculated from the intensity of radiation received by the pyrometer. In some embodiments, one or more additional pyrometers are employed to provide a more accurate temperature determination.

The reflector of the present invention is tailored to this pyrometry system. Since the determination of the temperature from the intensity of radiation emitted by the substrate preferably requires highly reflective conditions in the area around the inlets to the pyrometer(s), the portion of the reflector surrounding the inlets is highly reflective. Specifically, the surface of the reflector includes one or more recesses, to which the pyrometers are coupled. The surface of the reflector inside these recesses is highly reflective, facilitating measurement of the temperature through the pyrometers.

Outside the recesses, the surface of the reflector is raised, or "stepped," providing a number of advantages. Because the raised surface is closer to the substrate than the surface of prior art reflectors, the raised surface reduces the volume of purge gas necessary to fill the processing chamber during heating and cooling of the substrate, making that process faster and more cost-efficient. In addition, the surface of the reflector facing the substrate also includes portions having reduced reflectivity. During cooling, these portions absorb radiation emitted by the substrate, rather than reflecting it back to the substrate, thereby helping to cool the substrate. Preferably, the stepped surface is formed by placing a plate over the reflector body, wherein openings in the plate over the inlets to the pyrometers form recesses with the top of the reflector body.

For a better understanding of these and other aspects of the present invention, reference should be made to the following detailed description taken in conjunction with the accompanying drawings.

BRIEF DESCRIPTION OF THE DRAWINGS

In the drawings, which are not necessarily to scale.

DETAILED DESCRIPTION

The present invention is generally directed to a stepped reflector plate for use in thermally processing a substrate. A reflector plate has a stepped surface facing the substrate during heating and cooling of the substrate. The raised surface of the reflector plate is non-reflective, providing advantages during, among other things, cooling of the substrate. The reflector plate also includes a number of recesses, in which one or more pyrometers are positioned. These recesses have a reflective surface, providing advantages in the performance of the pyrometers.

The RTP System

Figure 1:
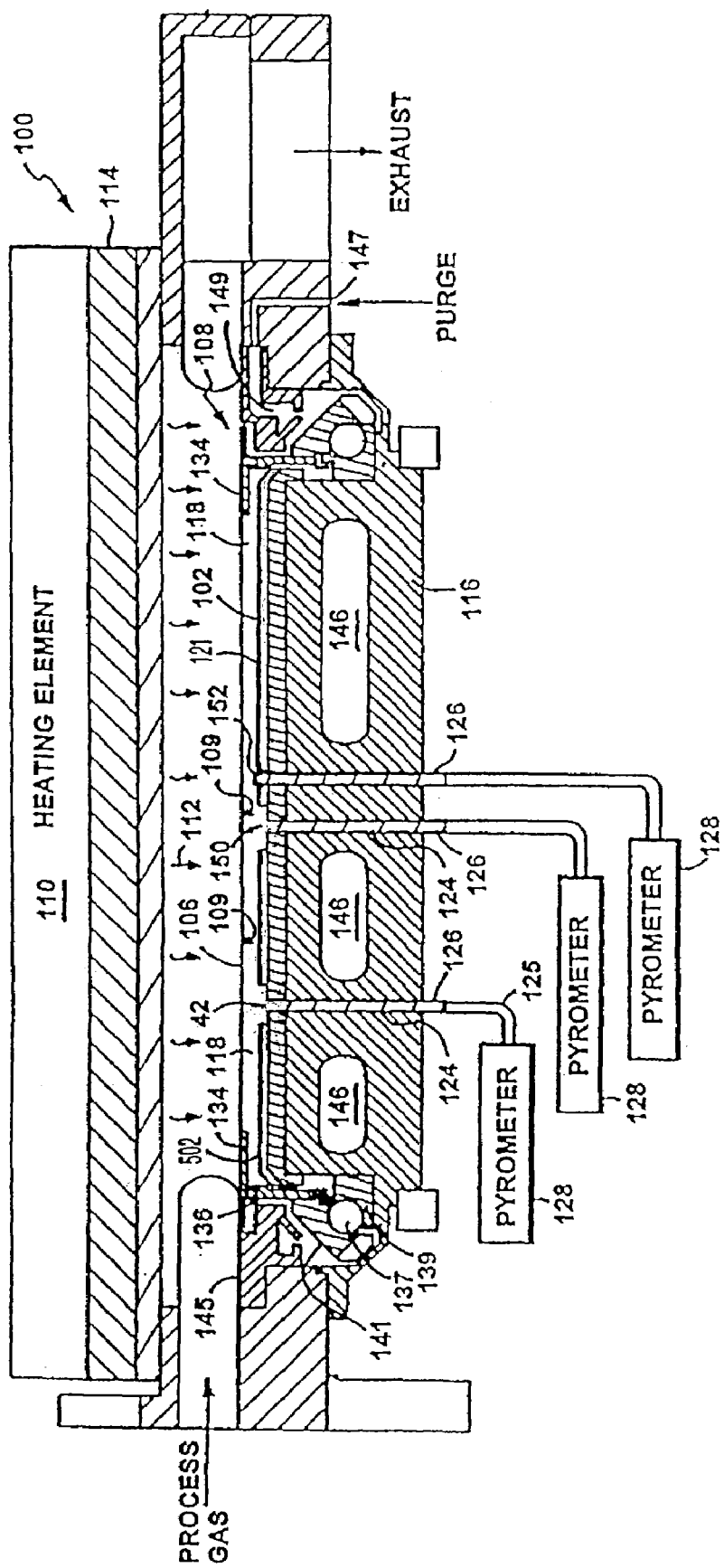
FIG. 1 is a schematic cross-sectional side view of an apparatus for measuring substrate temperature in which a reflector is positioned near a substrate, in accordance with one aspect of the present invention.

An RTP system in accordance with one embodiment of the present invention is shown in FIG. 1. The RTP system includes a processing chamber 100 for processing a substrate 106. In one embodiment of the present invention, the substrate 106 is a disk-shaped, eight inch (200 mm) diameter silicon substrate. In another, it is a twelve inch (300 mm) diameter silicon substrate. The substrate 106 is mounted inside the chamber 100 on a substrate support structure 108 and is heated by a heating element 110 positioned directly above the substrate. The heating element 110 generates radiation 112 which enters the processing chamber 100 through a water-cooled quartz window assembly 114 which is approximately one inch (25 mm) above the substrate. Beneath the substrate is a reflector 102 which is mounted on a water-cooled, stainless steel base 116. As shown in FIG. 1, the reflector 102 preferably includes an upper plate 502, as discussed below. The underside of the substrate 106 and a top surface 121 of the reflector 102 form a reflecting cavity 118 for enhancing the effective emissivity of the substrate, as will be discussed in more detail below.

In the embodiment shown in FIG. 1, the separation between an eight inch substrate 106 and reflector 102 is less than approximately 0.3 inch (7.6 mm), thus forming a cavity which has a width-to-height ratio of more than about 27 (i.e., 200 mm wafer diameter divided by 7.6 mm separation). If the separation is made too large, there will be a decrease in the emissivity-enhancement effect attributable to the virtual blackbody cavity that is formed. On the other hand, if the separation is too small, then the thermal conduction from the substrate to the cooled reflector will increase unacceptably. This will impose an unacceptably large thermal load on the heated substrate since the main mechanism for heat loss to the reflecting plate will be conduction through the gas, the thermal loading will, of course, depend up the type of gas and the chamber pressure during processing. Other factors regarding this separation are described below.

The temperatures at localized regions 109 of substrate 106 are measured by one or more temperature probes 150 (only three of which are shown in FIG. 1). The temperature probes are preferably sapphire light pipes that pass through a conduit 124 that extends from the backside of base 116 through the top of reflector 102. Sapphire light pipes 126 are about 0.125 inch (3 mm) in diameter and conduits 124 are slightly larger to enable them to be easily inserted into the conduits. In one embodiment of the present invention, one temperature probe 150 may be used to make temperature measurements, while another temperature probe 152 may serve as a correction probe.

As indicated above, although only three measurement probes are shown in FIG. 1, the described embodiment may actually use any suitable number of such probes, for example, eight measurement probes distributed over the reflector so as to measure the temperature at different radii of the substrate. During thermal processing, support structure 108 is rotated at, preferably, about 90 RPM. Thus, each probe actually samples the temperature profile of a corresponding annular ring area on the substrate.

The support structure which rotates the substrate includes a support ring 134 which contacts the substrate around the substrate's outer perimeter, thereby leaving all of the underside of the substrate exposed except for a small annular region about the outer perimeter. In one embodiment, the annular region of the support ring 134 has a radial width of approximately one inch (25 mm). To minimize the thermal discontinuities that will occur at the edge of substrate 106 during processing, support ring 134 is made of the same, or similar, material as the substrate, e.g. silicon or silicon carbide. The support ring 134 rests on a rotatable tubular quartz cylinder 136 that is coated with silicon to render it opaque in the frequency range of the pyrometers. The silicon coating on the quartz cylinder acts as a baffle to block out radiation from external sources that might distort the intensity measurements. The bottom of the quartz cylinder is held by an annular upper bearing race 141 which rests on a plurality of ball bearings 137 that are, in turn, held within an stationary, annular, lower bearing race 139. The ball bearings 137 are made of steel and coated with silicon nitride to reduce particulate formation during operation. The upper bearing race 141 is magnetically-coupled to an actuator (not shown) which rotates the cylinder 136, support ring 134 and substrate 106 at about 90 RPM during thermal processing.

In this embodiment, the support ring 134 is designed to create a seal with the quartz cylinder 136. Extending from the bottom surface of the support ring 134 is a cylindrically shaped lip which has an outside diameter that is slightly smaller than the inside diameter of the quartz cylinder, so that it fits into the cylinder, as shown, and forms a light seal. On the inside region of the support ring, there is a shelf for supporting substrate 106. The shelf is a region around the inside circumference of the support ring that is lower than the rest of the support ring. A purge ring 145 that is fitted into the chamber body surrounds the quartz cylinder. The purge ring 145 has an internal annular cavity 149 which opens up to a region above upper bearing race 141. The internal cavity 149 is connected to a gas supply (not shown) through a passageway 147. During processing, a purge gas is flowed into the chamber through purge ring 145.

The support ring 134 has an outer radius that is larger than the radius of the quartz cylinder so that it extends out beyond the quartz cylinder. The annular extension of the support ring beyond cylinder 136, in cooperation with purge ring 145 located below it, functions as a baffle which prevents stray light from entering the reflecting cavity at the backside of the substrate. To further reduce the possibility of stray light reflecting into the reflecting cavity, support ring 134 and purge ring 145 may also be coated with a material that absorbs the radiation generated by heating element 110 (e.g., a black or grey material).

As indicated above, the light pipes 126 are preferably made of sapphire. Sapphire light pipes are generally preferred because they have relatively small scattering coefficients and they tend to have greater transverse light rejection, thus they provide greater measurement localization. However, the light pipes can be made of any appropriate heat-tolerant and corrosion-resistant material, e.g., quartz, that can transmit the sampled radiation to the pyrometer. Alternatively, the radiation sampling system could be an optical system that includes a small-radius objective lens mounted in reflector 102 and a system of mirrors and lenses which communicate radiation collected by the lens to the pyrometer. Such a scheme may be less expensive than sapphire light pipes if appropriate off-the-shelf optical elements can be found. Alternatively, light pipes can also be made from a tube with a highly polished reflective inner surface.

An example of a suitable heating element 110 is disclosed in U.S. Pat. No. 5,155,336. This heating element uses light pipes (not shown) to deliver highly collimated radiation from tungsten-halogen lamps to processing chamber 100. The lamps are divided into twelve zones which are located in a radially symmetrical manner. The zones can be individually adjusted to allow the radiative heating of different areas of substrate 106 to be controlled.

In the embodiment of FIG. 1, a base 116 includes a circulation circuit 146 through which coolant circulates, thereby cooling the reflector and the reflecting surface. Water which is typically at about room temperature (23° C.) is circulated through the base 116 to keep the temperature of the reflector well below that of the heated substrate. For example, the temperature of the reflector may be kept at 100° C. or less. It is important to cool the reflector during RTP to discourage any possible chemical activity that might occur on its surface. If the reflector is allowed to heat up, this will tend to increase surface oxidation which could seriously degrade the reflectivity of the reflecting portions of the reflector. Achieving an effective emissivity enhancement depends on having and maintaining a highly reflective surface on those reflective portions. In addition, as the reflector assembly heats up, it will become a source of radiation which will distort the sampled signal.

In general, it is desirable in a system for processing silicon substrates to use a pyrometer that detects long radiation wavelengths (e.g., wavelengths greater than about 3.5 to 4 microns). However, this approach is best suited for temperatures above 700° C. At room temperature, a silicon wafer is transparent to wavelengths of light longer than around 1.0 microns. As the temperature of the substrate increases, the substrate becomes opaque to the longer wavelengths until, at about 700° C., the substrate becomes opaque to all wavelengths of interest. Thus, at temperatures below 700° C., a long wavelength sensitive pyrometer will be more apt to also detect light coming directly from the heat source. In short, the wavelength sampled by the pyrometer should vary with the process temperature. If the process temperature is substantially below 700° C., then the pyrometer should sample wavelengths shorter than 1.1 microns. If higher process temperatures are used, then longer wavelengths can be sampled.

In one design, particularly suitable for process temperatures between 900° C. and 1350° C., a solid-state pyrometer is used that is sensitive to radiation at wavelengths between 0.9 microns and 1.0 microns (e.g., a 900-LP-6.35C sensor combined with a 100-S8MS-B-8CV electronics box). In this temperature range, there is substantial amount of radiation produced in the wavelength range 0.9–1.0 microns providing high signal strengths and high signal-to-noise ratios.

The Reflector

Figure 2:
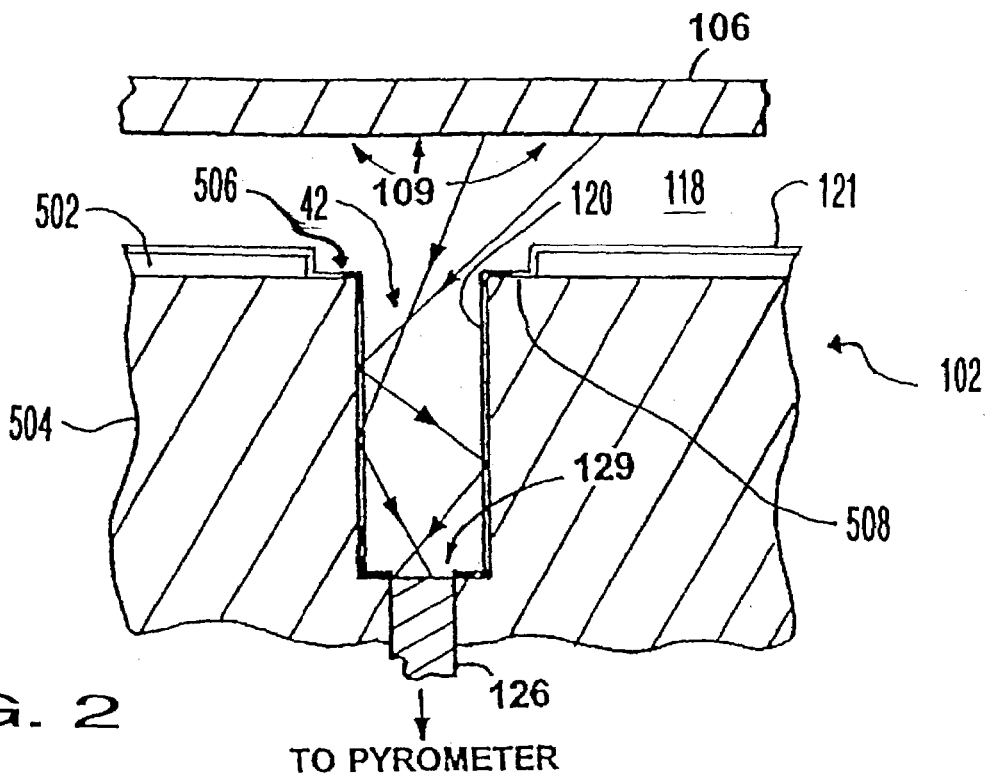
FIG. 2 is a partial cross-sectional side view of a reflective cavity in a reflector positioned near a substrate, in accordance with one aspect of the present invention.

FIG. 2 shows a reflector 102 in accordance with a preferred embodiment of the present invention. As shown in FIG. 2, one or more recesses 506 are formed in the upper surface of the reflector 102. Preferably, the reflector comprises a body portion 504 and an upper portion 502, which may be constructed by a suitable design such as a plate. Preferably, openings in the upper portion 502 of the reflector 102 form the sides of the recesses 506, and the upper surface 508 of the reflector body portion 504 forms the bottom of the recesses. Of course, other configurations for forming a recess could also be used within the scope of the present invention. For example, instead of an upper portion and a body portion, the reflector could comprise a single body having recesses formed on its surface such as, for example, cavities, bores, hollows, slots, orifices, or chambers.

In the embodiment shown in FIG. 2, the bottom of the recess 506 further comprises a small reflective cavity 42 (i.e., a microcavity) formed in the top surface of reflector body portion 504 where the conduit passes through to the top of the reflector. The conduit enters the small cavity forming an aperture 129 at the bottom of the small cavity. A sapphire light pipe 126 is positioned within conduit 124 so that its uppermost end is flush with or slightly below the bottom of microcavity 42. The other end of light pipe 126 couples to a flexible optical fiber 125 that transmits sampled light from the cavity to a pyrometer 128.

In the described embodiment, the microcavity 42 is cylindrically shaped, has a radius s(R) of about 0.100 inch and a depth (L) of about 0.300 inch. An aperture 129 at the bottom of microcavity 42 and the conduit 124 are slightly larger than about 0.125 inch (3 mm), which as noted above, is the diameter of the sapphire light pipe. The microcavity 42 functions to enhance the virtual blackbody effect of the reflecting cavity 118 that is present between the backside of the substrate 106 and the top of reflector 102, thereby increasing the effective emissivity of the substrate to a value that is even closer to one. The cylindrical microcavity increases both the signal-to-noise ratio of the sampled signal that is detected by the light pipe and the effective emissivity of the substrate (or equivalently, the effective reflectivity of the reflecting cavity). The enhancement effect does not appear to be strongly dependent on whether the probe end is flush with the bottom of the surface microcavity 42 or is placed below that point and recessed within the conduit 124. Thus, the operation of inserting the probe into the conduit during the assembly of the reflector is made easier by not having to satisfy close critical tolerances regarding the placement of the probe end. However, the probe end preferably should not protrude into the surface microcavity since this seems to degrade the enhancement effect.

Assuming perfectly reflecting sidewalls in the cylindrical microcavity, the enhancement effect caused by the cylindrical microcavity increases as the L/R ratio of the microcavity increases. However, since the sidewalls are not perfectly reflecting, the more times the collected radiation reflects back and forth within the cavity, the more its signal strength will be diminished by the losses which occur upon each reflection. Therefore, as a practical matter there is a limit to how large one can make the L/R aspect ratio of the cylindrical microcavity and still obtain improvements in performance.

The surface microcavity 42, which is formed around the end of the probe, appears to work by increasing the level of self-irradiation of a localized region of the substrate backside, by increasing the collection efficiency of the probe, or by a combination of both mechanisms. In other words, the surface cavities increase, relative to a planar reflector, the amount of light that reflects from the reflector back at the localized region 109 on the substrate where the temperature is to be measured. This also increases the probe's collection of radiation.

In the described embodiment, to achieve the high reflectivity that is desired for the reflector, a highly reflective multi-layered coating 120 is formed on the surface of the recess 506, including the microcavity 42. The bottom layer of the coating is preferably a thin layer of a highly reflective material. In one embodiment, the reflective material is gold, which is deposited onto the surface of the reflector body. Gold may be employed because it has a reflectivity of about 0.975 in the infra-red wavelength range of interest (i.e., about 950 nm).

To further enhance the reflectivity of the reflective coating 120, a quarter-wave stack may be formed on top of the reflective layer. The quarter-wave stack is made up of alternating dielectric layers which have different indices of refraction and have a thickness equal to ¼ of the wavelength to which the pyrometer is most sensitive (e.g., a thickness equal to ¼ of 950 nm).

A passivation layer (not shown) may be employed above the reflective layer, and, preferably, as the top layer of multi-layered coating 120. This passivation layer prevents the gold or other material of the reflecting layer from possibly contaminating the RTP chamber. The passivation layer may be made of silicon dioxide, aluminum oxide, silicon nitride, or any other acceptable material that will passivate the reflecting layer without degrading its reflective properties at the wavelength of interest.

The reflectivity of multi-layered coating 120 is about 0.995 at 950 nm, which is significantly higher than the natural reflectivity of the reflective material, e.g., 0.975 for a single thin gold film.

If gold is an unacceptable material for the reflective layer, other reflecting materials known in the art may, of course, be used. For example, nickel is more inert than gold and has a good reflectivity, though not as high as gold. Alternatively, aluminum has a reflectivity of approximately 0.900 at the wavelength of interest; and that reflectivity can be effectively increased to above 0.990 through the use of, for instance, a quarter-wave stack as described above. Moreover, other methods of achieving a highly reflective surface may also be employed within the scope of the present invention.

Outside the recesses 506, the surface 121 of the reflector 102 is more absorptive than the surface of the recess. Preferably, the reflectivity of the non-reflective surface 121 is less than half the reflectivity of the reflective surface 120 of the reflector 102 and therefore has a reflectivity of less than 0.500. Thus, surface 121 is more absorptive than reflective. Further, the surface 121 is absorptive across a range of radiation wavelengths so that it constitutes a broadband absorptive surface. This absorptive surface may be achieved in various ways known in the art. Preferably, the surface 121 is black anodized aluminum. Other methods, such as chemical plating, other materials, or other coatings, may also be used.

The reduced reflectivity surface 121 facilitates cooling of the substrate. During the cooling process, reflecting the radiation emitted by the substrate back to the substrate would, of course, slow down the cooling of the substrate. The reduced reflectivity surface 121 reduces such reflection, and thereby facilitates cooling of the substrate. Preferably, the reduced reflectivity surface 121 comprises at least half of the surface of the reflector 102 facing the substrate 106.

Figure 3:
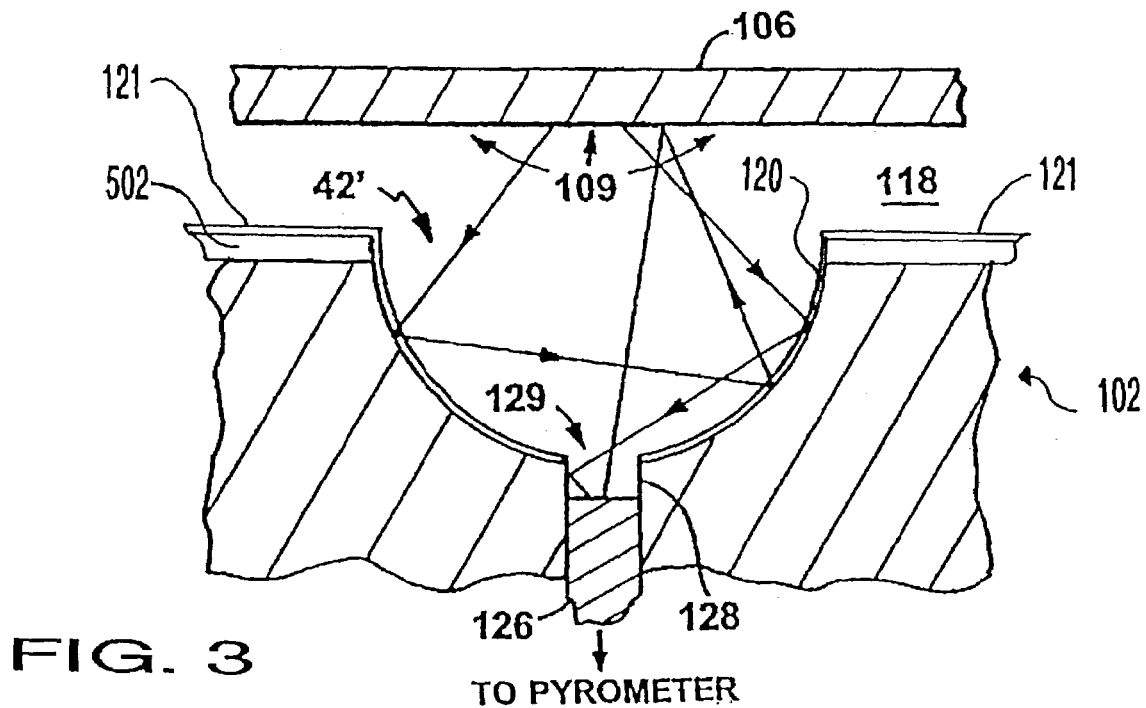
FIG. 3 is a partial cross-sectional side view of a reflective cavity in a reflector positioned near a substrate, in accordance with one aspect of the present invention.

Many other alternative geometries are possible for the surface microcavity. For example, a hemispherical microcavity 42', such as is shown in FIG. 3, may be used. In this embodiment, the microcavity is spherical in shape, with its center located in the plane of the reflector surface. For the RTP embodiment described above, the radius of the sphere is about 6–8 millimeters. A sapphire probe 126 is 0.125 inch (3 mm) in diameter, although it may be desirable to use a smaller size (e.g., 0.050 inch) to minimize the disturbance that the probe might cause to the substrate temperature in the localized region 109.

Figure 4:
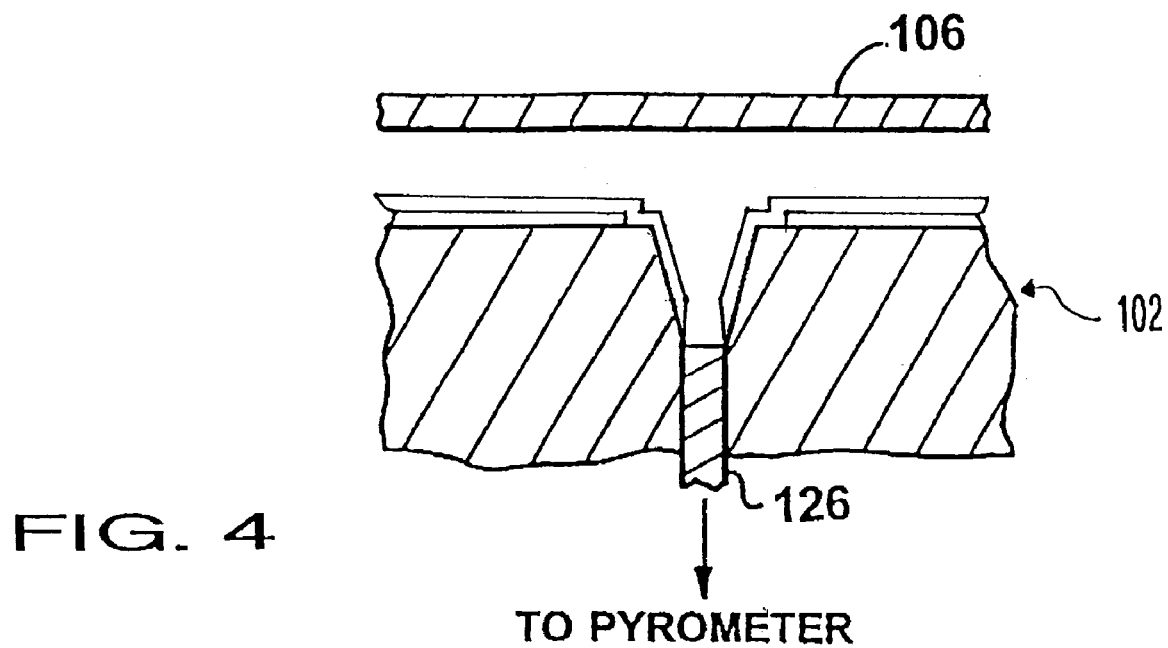
FIG. 4 is a partial cross-sectional side view of a reflective cavity in a reflector positioned near a substrate, in accordance with one aspect of the present invention.
Figure 5:
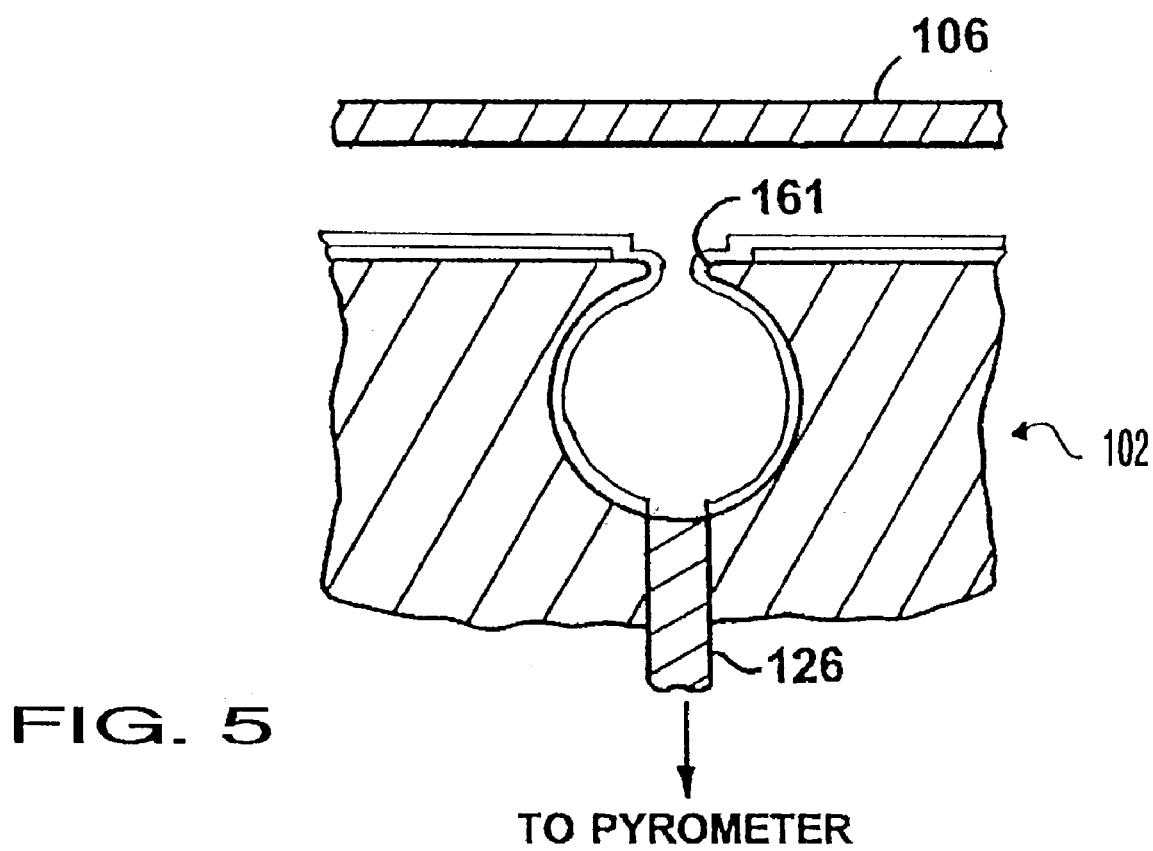
FIG. 5 is a partial cross-sectional side view of a reflective cavity in a reflector positioned near a substrate, in accordance with one aspect of the present invention.

Other suitable microcavity geometries will be apparent to those of skill in the art, such as the geometries shown in FIGS. 4 and 5. FIG. 4 shows a conical-shaped microcavity with the light pipe located at the vortex of the cone. FIG. 5 shows a spherical microcavity with the light pipe located opposite a circular aperture 161 in the surface of the reflector. These are just a few of the many alternative geometries that could be used. The particular microcavity geometry that is most appropriate for a given application can be empirically determined. In each case, the surface 121 of the reflector outside the region of the microcavity has a reflectivity less than half the reflectivity of the surface 120 in the microcavity.

Figure 6A:
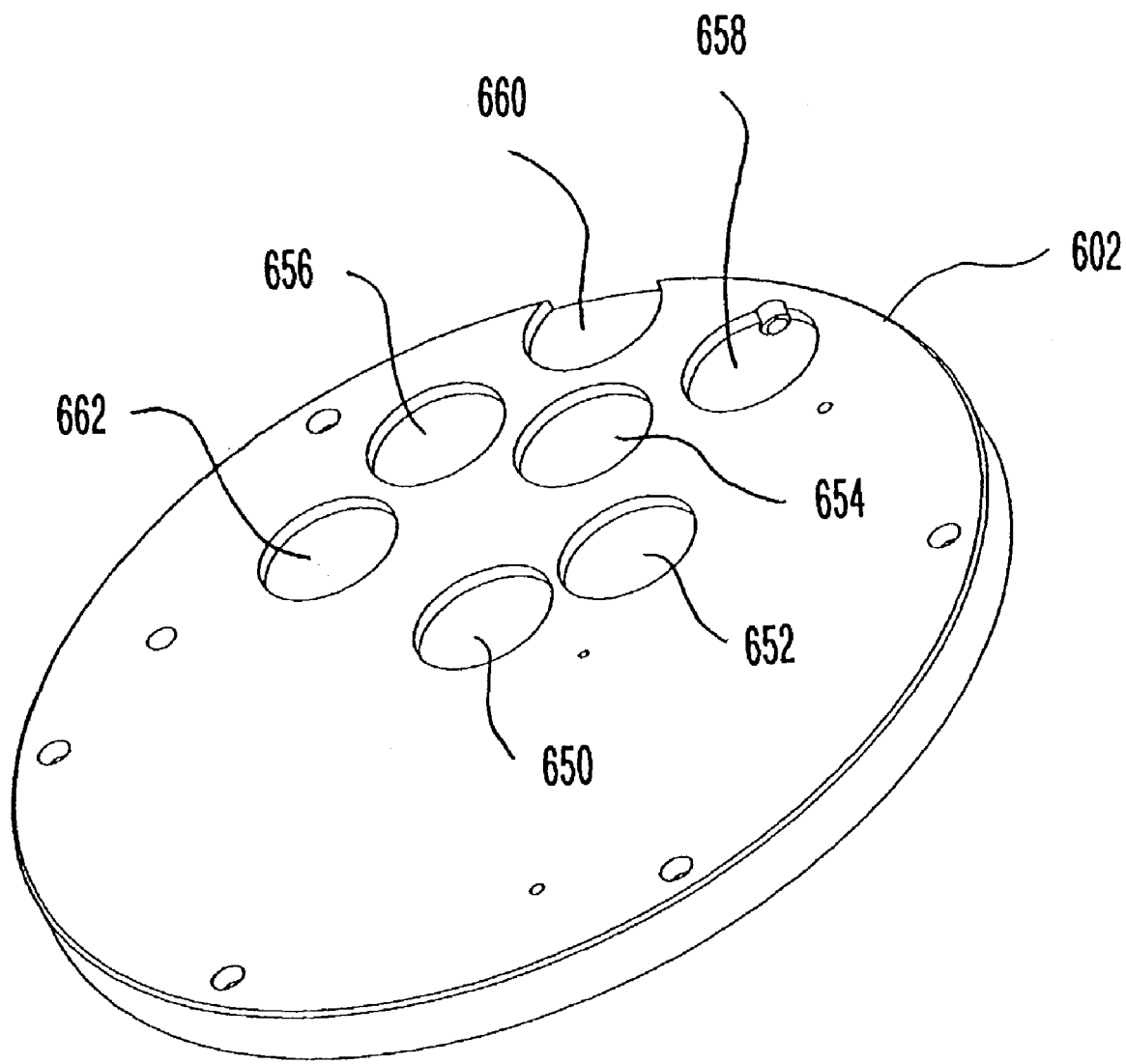
FIG. 6A is a perspective view of a reflector in accordance with one embodiment of the present invention.

FIG. 6A shows a reflector 602 in accordance with one embodiment of the present invention, in which a number of recesses 650–662 are formed in the surface of the reflector 602. As shown in FIG. 6A, the surface of the reflector 602 is raised, or stepped, above the reflective recesses 650–662.

One effect of this raised surface can be seen with reference to FIG. 1. As shown therein, the surface 121 of the reflector 102 is closer to the substrate 106 in the process chamber than in conventional process chambers. During the cooling phase of the substrate processing, this raised surface facilitates cooling of the substrate. Specifically, heat is transferred from the substrate to the gases in the reflective cavity 118, and then from those gases to the reflector 102. Because the surface of the reflector is closer to the substrate as compared to prior art systems, the distance through the gas between the reflector 102 and the substrate 106 is less, with the result that heat is more easily transferred from the substrate 106 to the reflector 102.

Another effect of the stepped surface of the reflector 102 is facilitation of filling or purging the reflective cavity 118 of gases. In one embodiment of the present invention, gases such as a purge gas are supplied into and/or removed from the reflective cavity 118. For instance, a purge gas may be supplied to the reflective cavity during heating or processing. In some embodiments, the purge gas supplied during heating may be selected based on its low thermal conductivity, so that the heat applied by the heating element 110 does not escape the substrate through the purge gas. Such gases include, without limitation, nitrogen, argon, xenon, or a combination of two or more of these gases.

A different purge gas may be supplied to the reflective cavity 118 during cooling of the substrate. For instance, a purge gas with a high thermal conductivity may be employed to increase the cool-down rate of the substrate. Such gases include, without limitation, helium, hydrogen, and combinations of those gases.

The process of supplying such gases to the reflective cavity 118, or removing such gases from the reflective cavity 118, is facilitated by the raised surface of the reflector 102. The raised surface reduces the volume of the reflective cavity. Accordingly, less gas is needed to fill the reflective cavity 118, and the gas can therefore be inserted or removed more quickly, providing advantages in the speed, cost, and efficiency of substrate processing.

Various configurations may be employed for the temperature probe 150 and corresponding recesses 506 of the reflector 102. In one configuration, the effective emissivity for the temperature measurement probe 150 may be larger than the effective emissivity for the correction probe 152. Alternatively to placing probe 152 closer to the backside of substrate 106, it could be placed in a cylindrical microcavity which has its bottom covered with a non-reflecting material. In some embodiments, it is desirable that the two probes yield different effective emissivities. In some embodiments, it is preferable that the two selected probe geometries produce a difference in associated effective emissivities that is maximized. In other embodiments, the two probes could be connected to the same recess.

In the described embodiment, probes 150, 152 are spaced-apart by sufficient distance so that the hole producing the lower effective emissivity does not interfere with or degrade the effective reflectivity of the other probe. However, the two probes should not be spaced so far apart that they do not measure the temperature of roughly the same region of the substrate. For the described embodiment, a typical separation which appears to meet these requirements is between 1 to 3 cm. If the substrate rotates, this means that the radii at which the two probes are located should differ by no more than this amount.

Radiation emitted from the substrate 106 is therefore transmitted to one or more pyrometers 128, as shown in FIG. 1. The substrate temperature corresponding to the radiation received at each pyrometer is then calculated using known techniques, such as those described in U.S. Pat. No. 5,660,472. According to one method described therein, two or more probes may be calibrated using a special calibration substrate of known emissivity. Generally, the effective reflectivity of the probes is determined from this calibration. Using that effective reflectivity and known plots of effective emissivity versus emissivity for certain effective reflectivities, the actual emissivity for the substrate 106 may be determined. Knowing the effective emissivity of the substrate 106, the corrected temperature of the substrate, based on the radiation received by the pyrometers, can be determined.

Figure 6B:
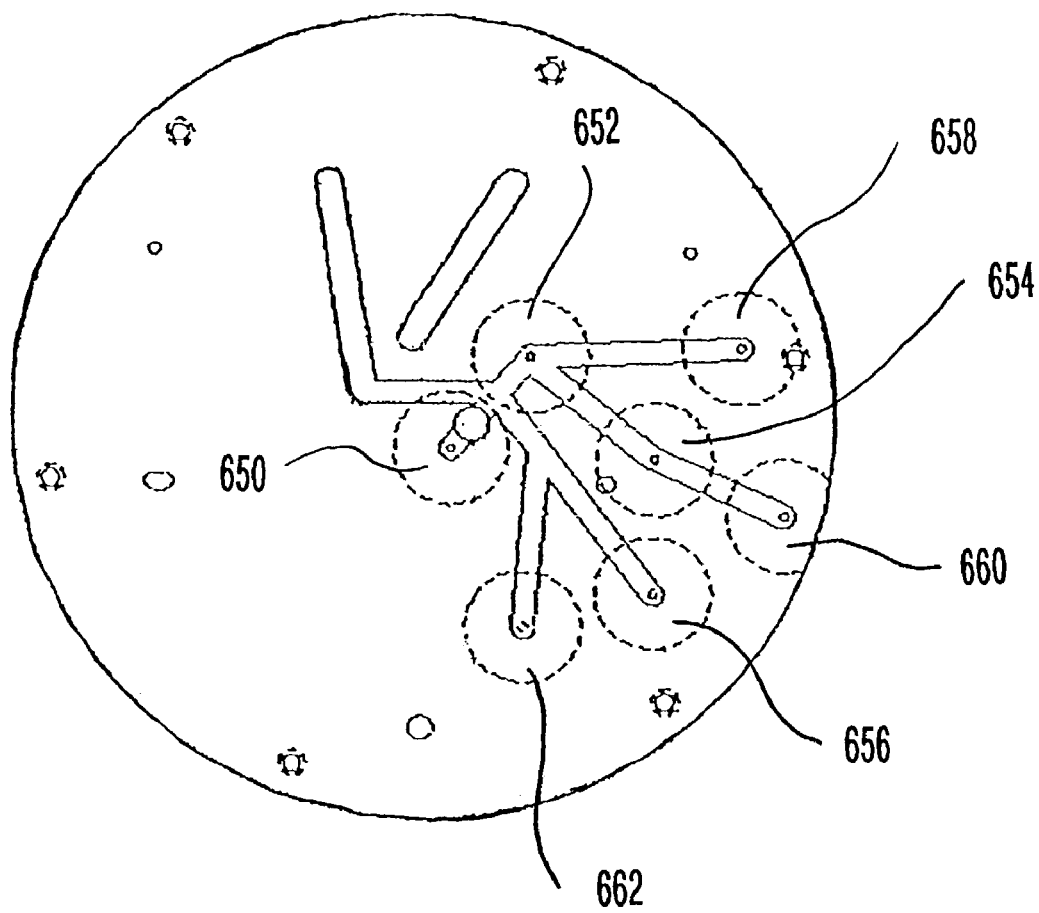
FIG. 6B is a bottom view of the reflector shown in FIG. 6A.

Preferably, as shown in FIGS. 6A and 6B, radiation is collected at recesses 650, 652, 654, 656, 658, 660, and 662 in the reflector 602, for conveyance to pyrometers (not shown in FIGS. 6A and 6B). The positions of these recesses, and the corresponding conduits leading to the pyrometers, are preferably selected to sample the temperature of desired control points on the reflector 602 (corresponding to desired control points on the substrate), as well as to optimize the emissivity measurement. For instance, one recess 662 is positioned the same radial distance from the center of the reflector 602 as a second recess 654. Once the pyrometers have been calibrated, the emissivity of the substrate may be determined from the radiation received at each recess 654, 662. Using that calculated emissivity, the temperatures corresponding to the radiation received at each of the recesses 650, 652, 654, 656, 658, 660, and 662 can be determined. Of course, the particular number and configuration of the sampling points are merely exemplary, and may be varied within the scope of the invention.

Those skilled in the art to which the invention pertains may make modifications and other embodiments employing the principles of this invention without departing from its spirit or essential characteristics particularly upon considering the foregoing teachings. The described embodiments are to be considered in all respects only as illustrative and not restrictive and the scope of the invention is, therefore, indicated by the appended claims rather than by the foregoing description Consequently, while the invention has been described with reference to particular embodiments, modifications of structure, sequence, materials and the like will be apparent to those skilled in the art, yet still fall within the scope of the invention.

What is claimed is:

1. An apparatus for thermally processing a substrate comprising:

a chamber;

a support for mounting a substrate in the chamber;

a heating element positioned to heat the substrate when it is mounted on the support;

a reflecting body positioned in the chamber having a upper surface including a top planar surface that faces the substrate when the substrate is mounted on the support;

said top planar surface comprising a reduced reflectivity portion;

said surface further comprising one or more highly reflecting portions, a first said highly reflecting portion forming a recess in said planar surface; and one or more pyrometers, a first said pyrometer coupled to said recess.

2. The apparatus of claim 1, wherein the reflectivity of the reduced reflectivity portion has a value that is less than half the reflectivity of said first highly reflecting portion.

3. The apparatus of claim 1, wherein the reflectivity of said first highly reflecting portion is greater than 0.99.

4. An apparatus for thermally processing a substrate comprising:
a chamber;
a support for mounting a substrate in the chamber;
a heating element positioned to heat the substrate when it is mounted on the support;
a reflecting body positioned in the chamber having a surface that faces the substrate when the substrate is mounted on the support;
said surface comprising a reduced reflectivity portion, wherein the reduced reflectivity portion comprises at least half of the surface of the reflecting body;
said surface further comprising one or more highly reflecting portions, a first said highly reflecting portion forming a recess in said surface; and
one or more pyrometers, a first said pyrometer coupled to said recess.

5. The apparatus of claim 1, wherein the reduced reflectivity portion is anodized aluminum.

6. The apparatus of claim 1, wherein the reduced reflectivity portion comprises a non-reflective coating over a base material.

7. The apparatus of claim 1, further comprising:
a second said pyrometer coupled to a second recess wherein said first recess has a different emissivity from said second recess.

8. An apparatus for thermally processing a substrate comprising:
a chamber;
a support for mounting a substrate in the chamber;
a heating element positioned to heat the substrate when it is mounted on the support;
a reflecting body positioned in the chamber having a surface that faces the substrate when the substrate is mounted on the support, wherein the ratio of the maximum width of the substrate to the distance between the bottom surface of the substrate and the top surface of the reflecting body is greater than 27;
said surface comprising a reduced reflectivity portion;
said surface further comprising one or more highly reflecting portions, a first said highly reflecting portion forming a recess in said surface; and
one or more pyrometers, a first said pyrometer coupled to said recess.

9. An apparatus for thermally processing a substrate comprising:
a heating element positioned to heat the substrate;
a cooling body positioned to receive radiation emitted by the substrate;
said cooling body comprising a reduced reflectivity portion formed on a top planar surface thereof facing said substrate to absorb radiation emitted by the substrate and a highly reflecting portion formed on a sidewall of a hole extending into said cooling body; and
at least one pyrometer coupled to the highly reflecting portion, wherein said highly reflecting portion formed on said sidewall reflects radiation emitted by the substrate to the at least one pyrometer.

10. A reflector for rapid thermal processing of a substrate, comprising:
a body portion; and
one or more openings formed in an upper portion of said body portion; a first said opening overlying a first portion of the body portion, and said first portion and said upper portion forming a first recess in a surface of the reflector facing the substrate, wherein a planar surface of said reflector within said first recess facing the substrate is highly reflective.

11. A reflector for rapid thermal processing of a substrate, comprising:
a body portion;
an upper portion overlying the body portion, the upper portion comprising one or more openings; a first said opening overlying a first portion of the body portion, and said first portion and said upper portion forming a first recess in a surface of the reflector facing the substrate; and
wherein the surface of said reflector within said first recess is highly reflective; and
wherein said upper portion further comprises a reduced reflectivity portion wherein said upper portion further comprises a reduced reflectivity portion.

12. A reflector for rapid thermal processing of a substrate, comprising:
a reflecting body having a horizontally extending surface facing the substrate;
said surface comprising a planar horizontally extending reduced reflectivity portion and one or more highly reflective portions, a first said highly reflective portion forming a first recess in said surface;
said reflecting body further comprising a conduit to convey radiation from said first recess to a pyrometer.

13. A method for thermally processing a substrate comprising:
positioning a reflecting body having reduced reflectivity portion formed in a top planar surface facing said substrate and one or more highly reflective portions facing said substrate;
heating said substrate;
measuring the intensity of radiation emitted by the substrate using one or more pyrometers, a first pyrometer coupled to a first highly reflective portion of the reflecting body; and
determining the temperature of the substrate from the intensity measured by the pyrometer.

14. The method of claim 13, wherein measuring the intensity of the radiation comprises measuring the intensity at said first pyrometer from the first highly reflective portion of the reflecting body and measuring the intensity at a second said pyrometer coupled to a second highly reflective portion of the reflecting body.

15. The method of claim 13, further comprising cooling said substrate by conducting heat from the substrate to the reflecting body.

16. The method of claim 13, further comprising cooling said substrate by absorbing radiation emitted by the substrate at the reduced reflectivity portion of the reflecting body.

17. A method for thermally processing a substrate comprising:
positioning a reflecting body having a reduced reflectivity portion and one or more highly reflective portions facing said substrate, wherein said reduced reflectivity portion of the reflecting body comprises at least half of the surface of the reflecting body which faces the substrate;
heating said substrate;

measuring the intensity of radiation emitted by the substrate using one or more pyrometers, a first pyrometer coupled to a first highly reflective portion of the reflecting body; and determining the temperature of the substrate from the intensity measured by the pyrometer.

18. A method for thermally processing a substrate comprising:

positioning a cooling body having a reduced reflectivity portion formed in a top planar surface facing said substrate and one or more highly reflective portions facing said substrate;

measuring an intensity of radiation emitted by the substrate using one or more pyrometers, a first said pyrometer coupled to a highly reflective portion of the cooling body;

determining the temperature of the substrate from the intensity measured by the first pyrometer; and cooling said substrate by absorption through the reduced reflectivity portion of the cooling body of the radiation emitted by the substrate.

19. A method for thermally processing a substrate comprising:

positioning a reflecting body having a reduced reflectivity portion formed in a top planar surface facing the substrate and one or more highly reflective portions, one said highly reflective portion forming a reflective cavity facing the substrate;

using a first probe and a second probe to measure energy from the reflective cavity, said first probe having associated therewith a first effective reflectivity and said second probe having associated therewith a second effective reflectivity, the sampled energy from the first probe producing a first temperature indication and the sampled energy from the second probe producing a second temperature indication, and wherein the first effective reflectivity is different from the second effective reflectivity;

deriving a corrected temperature at least in part from the first and second temperature indications; and heating the substrate until the corrected temperature reaches a desired temperature.

20. The method of claim 19, wherein said step of cooling further comprises conducting heat from the substrate to the reduced reflectivity portion of the reflecting body.

21. The apparatus of claim 9, wherein said highly reflecting portion is additionally formed on a surface facing said substrate of a recess which is formed in said body from said top planar surface and from which said hole extends into said body.

22. The apparatus of claim 9, wherein said reduced reflectivity portion comprising at least half of an entire upper surface of said cooling body facing the substrate.

23. A reflector for rapid thermal processing of a substrate, comprising:

a reflecting body having a surface facing the substrate; said surface comprising a reduced reflectivity portion and one or more highly reflective portions, a first said highly reflective portion forming a first recess in said surface, wherein the reduced reflectivity portion is formed in at least half of an entire upper surface of said reflecting body facing the substrate;

said reflecting body further comprising a conduit to convey radiation from said first recess to a pyrometer.

24. The method of claim 13, wherein said planar surface is a top planar surface facing and extending in parallel to a principal surface of said substrate.

25. The method of claim 13, wherein said reduced reflectivity portion is formed in at least half of the entire place surface facing the substrate.

26. The method of claim 18, wherein the reduced reflectivity portion is formed in at least half of the entire planar surface facing said substrate.

27. A thermal processing apparatus, comprising:

a chamber;

a support for a substrate in said chamber;

a heating element positioned to heat the a first side of the supported substrate;

a reflector having a front surface positioned to face a second side of the supported substrate, comprising:

a liquid-cooled body;

a first area constituting at least half of said front surface having a first reflectivity for radiation emitted by said substrate heated by said heating element of no more than 50%;

a second area of said front surface having a second reflectivity for said radiation of substantially greater than 50%; and an optical conduit penetrating said body into an opening in said body penetrating said second area and connectable to a pyrometer.

28. The apparatus of claim 27, wherein said second area second reflectivity is at least 99%.

29. The apparatus of claim 27, wherein a hole is formed in said substrate including sidewalls including said second area and wherein said optical conduit has an end at a bottom of said hole.

30. The apparatus of claim 21, further comprising a sapphire light pipe accommodated in said conduit coupling said radiation from said first recess to said pyrometer.

31. The reflector of claim 12, wherein the first recess has a highly reflective planar surface surrounded by the reduced reflectivity portion which is higher than the recess.

32. The method of claim 17, wherein the reduced reflectivity portion is formed in a top planar surface of the reflecting body.

* * * * *